United States Patent
Biacs

(10) Patent No.: US 7,664,764 B2
(45) Date of Patent: *Feb. 16, 2010

(54) METHOD AND SYSTEM FOR STORAGE AND FAST RETRIEVAL OF DIGITAL TERRAIN MODEL ELEVATIONS FOR USE IN POSITIONING SYSTEMS

(75) Inventor: Zoltan Biacs, San Mateo, CA (US)

(73) Assignee: QUALCOMM Incorporated, San Diego, CA (US)

( * ) Notice: Subject to any disclaimer, the term of this patent is extended or adjusted under 35 U.S.C. 154(b) by 367 days.

This patent is subject to a terminal disclaimer.

(21) Appl. No.: 11/143,350

(22) Filed: Jun. 1, 2005

(65) Prior Publication Data

US 2006/0074958 A1    Apr. 6, 2006

Related U.S. Application Data

(63) Continuation of application No. 10/057,189, filed on Jan. 25, 2002, now Pat. No. 6,985,903.

(51) Int. Cl.
G06F 17/00 (2006.01)
(52) U.S. Cl. ................ 707/101; 709/203; 348/14.1
(58) Field of Classification Search ........... 707/1–10, 707/100–102, 200–206
See application file for complete search history.

(56) References Cited

U.S. PATENT DOCUMENTS 5,264,848 A * 11/1993 McGuffin ............ 341/94
5,812,087 A    9/1998 Krasner
5,841,396 A    11/1998 Krasner
5,902,347 A * 5/1999 Backman et al. ......... 701/200
5,945,944 A    8/1999 Krasner (Continued)

FOREIGN PATENT DOCUMENTS

JP             08285932          11/1996

(Continued)

OTHER PUBLICATIONS

International Search Report, PCT/2003/02223, International Search Authority/EPO, Oct. 14, 2004, (2 pages).

(Continued)

*Primary Examiner*—Sathyanarayan Pannala
(74) *Attorney, Agent, or Firm*—Shyam K. Parekh

(57) ABSTRACT

Methods and apparatuses to generate and to access compressed and indexed elevations of Digital Elevation Models. In one aspect of the invention, a method to store elevation data includes: compressing elevation data of a first portion of a Digital Elevation Model (DEM) to generate first compressed elevation data; storing the first compressed elevation data in a storage location pointed to by a first index; and storing the first index. In another aspect of the invention, a method to retrieve elevation data includes: locating a first compressed portion of a Digital Elevation Model (DEM) using a first index; and decompressing the first compressed portion to retrieve first elevation data for at least one sample point in the Digital Elevation Model. The Digital Elevation Model has a plurality of compressed portions which includes the first compressed portion; and the first index points to a storage location where the first compressed portion is stored.

24 Claims, 16 Drawing Sheets

U.S. PATENT DOCUMENTS

| | | | |
|---|---|---|---|
| 6,023,278 A * | 2/2000 | Margolin | 345/419 |
| 6,061,018 A | 5/2000 | Sheynblat | |
| 6,161,148 A | 12/2000 | Pratt et al. | |
| 6,215,442 B1 | 4/2001 | Sheynblat | |
| 6,229,546 B1 * | 5/2001 | Lancaster et al. | 345/419 |
| 6,317,690 B1 * | 11/2001 | Gia | 701/301 |
| 6,401,038 B2 * | 6/2002 | Gia | 701/301 |
| 6,757,445 B1 * | 6/2004 | Knopp | 382/285 |
| 2002/0188669 A1 * | 12/2002 | Levine | 709/203 |
| 2004/0075738 A1 | 4/2004 | Burke et al. | |

FOREIGN PATENT DOCUMENTS

| | | |
|---|---|---|
| JP | 10312153 | 11/1998 |
| JP | 2000517050 | 12/2000 |
| RU | 2138845 | 9/1999 |
| WO | 99057575 | 11/1999 |
| WO | 01065522 | 9/2001 |

OTHER PUBLICATIONS

International Preliminary Examination Report-PCT/US2003/002223, International Preliminary Examining Authority/US-Alexandria, Virginia-Dec. 8, 2006.

European Search Report, EP06004083 - European Patent Office, Munich - May 17, 2006.

* cited by examiner

METHOD AND SYSTEM FOR STORAGE AND FAST RETRIEVAL OF DIGITAL TERRAIN MODEL ELEVATIONS FOR USE IN POSITIONING SYSTEMS

CROSS-REFERENCE TO RELATED APPLICATIONS

This application is a continuation of U.S. patent application Ser. No. 10/057,189, filed on Jan. 25, 2002, now U.S. Pat. No. 6,985,903, and assigned to the assignee of the present application.

FIELD OF THE INVENTION

The invention relates to wireless assisted hybrid positioning systems, and more particularly to storage and retrieval of digital terrain model elevations.

BACKGROUND OF THE INVENTION

To perform position location in wireless cellular networks (e.g., a cellular telephone network), several approaches perform triangulation based upon the use of timing information sent between each of several basestations and a mobile device, such as a cellular telephone. One approach, called Advanced Forward Link Trilateration (AFLT) or Enhanced Observed Time Difference (EOTD), measures at the mobile device the times of arrival of signals transmitted from each of several basestations. These times are transmitted to a Position Determination Entity (PDE) (e.g., a location server), which computes the position of the mobile device using these times of reception. The times-of-day at these basestations are coordinated such that at a particular instance of time, the times-of-day associated with multiple basestations are within a specified error bound. The accurate positions of the basestations and the times of reception are used to determining the position of the mobile device.

FIG. 1 shows an example of an AFLT system where the times of reception (TR1, TR2, and TR3) of signals from cellular basestations 101, 103, and 105 are measured at the mobile cellular telephone 111. This timing data may then be used to compute the position of the mobile device. Such computation may be done at the mobile device itself, or at a location server if the timing information so obtained by the mobile device is transmitted to the location server via a communication link. Typically, the times of receptions are communicated to a location server 115 through of one the cellular basestations (e.g., basestation 101, or 103, or 105). The location server 115 is coupled to receive data from the basestations through the mobile switching center 113. The mobile switching center 113 provides signals (e.g., voice communications) to and from the land-line Public Switched Telephone System (PSTS) so that signals may be conveyed to and from the mobile telephone to other telephones (e.g., land-line phones on the PSTS or other mobile telephones). In some cases the location server may also communicate with the mobile switching center via a cellular link. The location server may also monitor emissions from several of the basestations in an effort to determine the relative timing of these emissions.

In another approach, called Time Difference of Arrival (TDOA), the times of reception of a signal from a mobile device is measured at several basestations. FIG. 1 applies to this case if the arrows of TR1, TR2, and TR3 are reversed. This timing data may then be communicated to the location server to compute the position of the mobile device.

Yet a third method of doing position location involves the use in the mobile device of a receiver for the United States Global Positioning Satellite (GPS) system or other Satellite Positioning System (SPS), such as the Russian Glonass system and the proposed European Galileo System, or a combination of satellites and pseudolites. Pseudolites are ground-based transmitters, which broadcast a PN code (similar to a GPS signal) modulated on an L-band carrier signal, generally synchronized with SPS time. Each transmitter may be assigned a unique PN code so as to permit identification by a remote receiver. Pseudolites are useful in situations where SPS signals from an orbiting satellite might be unavailable, such as tunnels, mines, buildings or other enclosed areas. The term "satellite", as used herein, is intended to include pseudolite or equivalents of pseudolites, and the term GPS signals, as used herein, is intended to include GPS-like signals from pseudolites or equivalents of pseudolites. Such a method using a receiver for SPS signals may be completely autonomous or may utilize the cellular network to provide assistance data or to share in the position calculation. Examples of such a method are described in U.S. Pat. No. 5,841,396; U.S. Pat. No. 5,945,944; and U.S. Pat. No. 5,812,087. As a shorthand, we call these various methods "SPS". In practical low-cost implementations, both the mobile cellular communications receiver and the SPS receiver are integrated into the same enclosure and, may in fact share common electronic circuitry.

A combination of either the AFLT or TDOA with an SPS system is called a "hybrid" system.

In yet another variation of the above methods, the round trip delay (RTD) is found for signals that are sent from the basestation to the mobile device and then are returned. In a similar, but alternative, method the round trip delay is found for signals that are sent from the mobile device to the basestation and then returned. Each of these round-trip delays is divided by two to determine an estimate of the one-way time delay. Knowledge of the location of the basestation, plus a one-way delay constrains the location of the mobile device to a circle on the earth. Two such measurements then result in the intersection of two circles, which in turn constrains the location to two points on the earth. A third measurement (even an angle of arrival or cell sector) resolves the ambiguity.

Altitude aiding has been used in various methods for determining the position of a mobile device. Altitude aiding is typically based on a pseudomeasurement of the altitude. The knowledge of the altitude of a location of a mobile device constrains the possible positions of the mobile device to a surface of a sphere (or an ellipsoid) with its center located at the center of the earth. This knowledge may be used to reduce the number of independent measurements required to determine the position of the mobile device. Typically, an estimated altitude can be manually supplied by the operator of the mobile device, or be set to an altitude from a previous three-dimensional solution, or be set to a predetermined value, or be derived from mapping information, such as a topographical or geodetic database, maintained at a location server.

U.S. Pat. No. 6,061,018, which is hereby incorporated here by reference, describes a method where an estimated altitude is determined from the information of a cell object, which may be a cell site that has a cell site transmitter in communication with the mobile device. U.S. Pat. No. 6,061,018 also describes a method of determining the condition of the measurements of the pseudoranges from a plurality of SPS satellites by comparing an altitude calculated from the pseudorange measurements with the estimated altitude.

Sometimes a table of lower resolution altitude data is stored in memory. Typically, high-resolution mapping information, such as a topographical or geodetic database, is stored in one or more flat files (non-indexed) at a location server. For example, a global Digital Elevation Model (DEM) with a horizontal grid spacing of 30 arc seconds (approximately 1 kilometer) may be obtained from U.S. Geological Survey on a set of five CD-ROMs. A DEM file from U.S. Geological Survey (http://edcdaac.usgs.gov/) is provided as 16-bit signed integers in a simple generic binary raster format. There is limited header and sometimes trailer bytes embedded in the image data. The data are stored in row major order (all the data for row 1, followed by all the data for row 2, etc.).

Sometimes, a Digital Elevation Model (DEM) is also referred to as a Digital Terrain Model (DTM).

SUMMARY OF THE INVENTION

Methods and apparatuses to generate and to access compressed and indexed elevations of Digital Elevation Models are described here.

In one aspect of the invention, a method to store elevation data includes: compressing elevation data of a first portion of a Digital Elevation Model (DEM) to generate first compressed elevation data; storing the first compressed elevation data in a storage location pointed to by a first index; and storing the first index. In one example according to this aspect, the elevation data of the first portion is compressed by: subtracting a reference elevation from the elevation data of the first portion of the Digital Elevation Model (DEM) to generate normalized elevation data; scaling the normalized elevation data to generate scaled elevation data; and run length encoding the scaled elevation data to generate the first compressed elevation data. In one example, the parameters required for determining whether or not a location is in the first portion of the Digital Elevation Model, as well as the transformation data specifying a coordinate system used to represent the elevation data of the first portion of the Digital Elevation Model, are also stored. In one example, a Digital Elevation Model is divided into a plurality of areas; an area of the Digital Elevation Model is divided into a plurality of tiles; and the profiles in each of the plurality of tiles of an area of the Digital Elevation Model are individually compressed. Parameters required for determining whether or not a location is in one of the plurality of tiles, as well as the parameters required for determining whether or not a location is in one of the plurality of areas, are also stored.

In another aspect of the invention, a method to retrieve elevation data includes: locating a first compressed portion of a Digital Elevation Model (DEM) using a first index; and decompressing the first compressed portion to retrieve first elevation data for at least one sample point in the Digital Elevation Model. The Digital Elevation Model has a plurality of compressed portions which includes the first compressed portion; and the first index points to a storage location where the first compressed portion is stored.

In one example according to this aspect, the first compressed portion is decompressed by: run length decoding the first compressed portion to generate scaled elevation data; inverse scaling the scaled elevation data to generate normalized elevation data; and adding a reference elevation to the normalized elevation data to generate the first elevation data. In one example according to this aspect, the plurality of compressed portions are stored in one of: a) a Memory Mapped File (MMF); b) Random Access Memory (RAM); and c) a file in a file system on a digital processing system; and the plurality of compressed portions are portions of compressed profiles in a tile of the Digital Elevation Model.

In one example, to compute an elevation of a location, an area in a plurality of areas of a Digital Elevation Model is identified; a tile that contains the location is identified from a plurality of tiles in the area; a profile that is in the vicinity of the location is identified; and at least a portion of the profile is decompressed to retrieve elevation data of at least one sample point. A plurality of sample points in the vicinity of the location are identified. After the elevations of the plurality of sample points are retrieved from the Digital Elevation Model, the elevation of the location is computed from an interpolation using the elevations of the plurality of sample points. A coordinate transformation is performed to express a horizontal position of the location in a coordinate system used by the Digital Elevation Model. In computing the elevation of the location, a coordinate transformation is performed so that the elevation of location is expressed in a coordinate system used by a Position Determination Entity. The elevation of the location is provided to the Position Determination Entity to perform altitude aiding in a positioning system. The elevation is provided in real time in response to a request from a Position Determination Entity in one scenario; and the elevation is provided to fill in information for basestation almanac data, which is subsequently used by a Position Determination Entity for altitude aiding, in another scenario.

The present invention includes apparatuses which perform these methods, including data processing systems which perform these methods and computer readable media which when executed on data processing systems cause the systems to perform these methods.

Other features of the present invention will be apparent from the accompanying drawings and from the detailed description which follow.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention.

At least one embodiment of the present invention seeks to efficiently store terrain elevation data in a database and to efficiently use the terrain elevation data in the database to provide an estimated altitude for a location.

Figure 2:
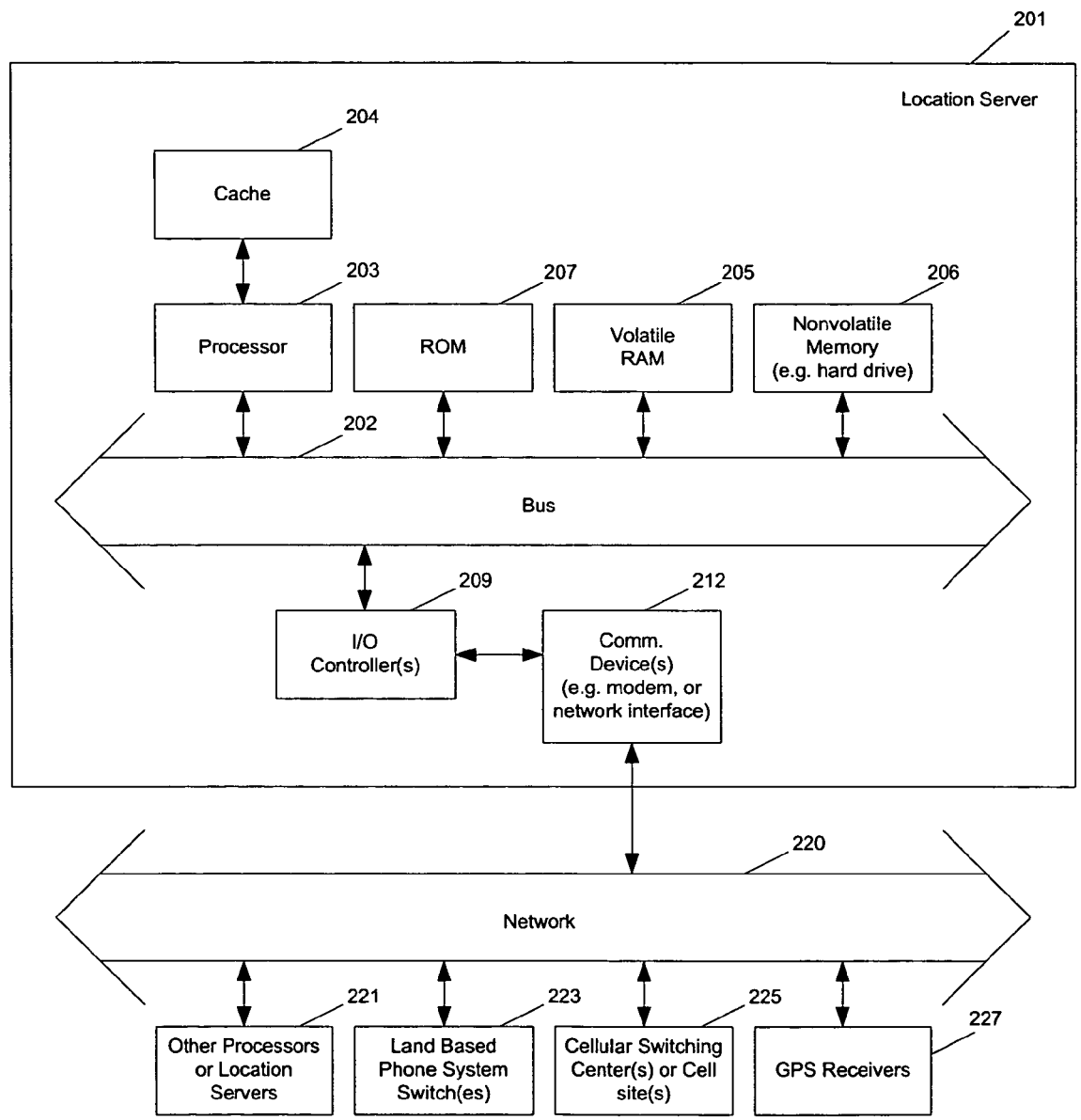
FIG. 2 shows an example of a location server which may be used with the present invention.

FIG. 2 shows an example of a data processing system which may be used as a server in various embodiments of the present invention. For example, as described in U.S. Pat. No. 5,841,396, the server may provide assistance data such as Doppler or other satellite assistance data to the GPS receiver in a mobile station. In addition, or alternatively, the location server may perform the final position calculation rather than the mobile station (after receiving pseudoranges or other data from which pseudoranges can be determined from the mobile station) and then may forward this position determination to the basestation or to some other system. The data processing system as a location server typically includes communication devices 212, such as modems or network interface. The location server may be coupled to a number of different networks through communication devices 212 (e.g., modems or other network interfaces). Such networks include the cellular switching center or multiple cellular switching centers 225, the land based phone system switches 223, cellular basestations, other GPS signal sources 227, or other processors of other location servers 221.

Figure 1:
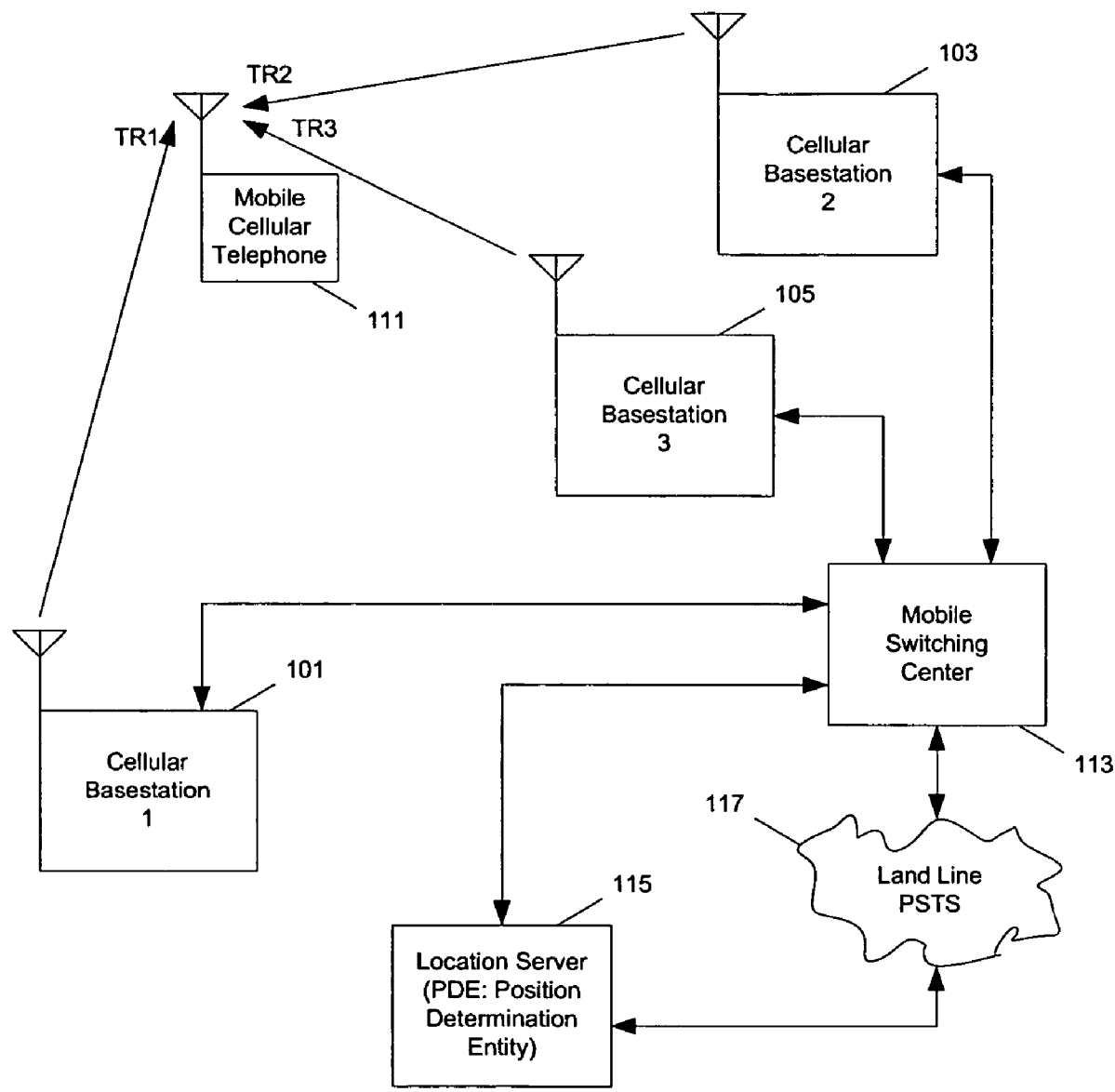
FIG. 1 shows an example of a prior art cellular network which determines the position of a mobile cellular device.

Multiple cellular basestations are typically arranged to cover a geographical area with radio coverage, and these different basestations are coupled to at least one mobile switching center, as is well known in the prior art (e.g., see FIG. 1). Thus, multiple basestations would be geographically distributed but coupled together by a mobile switching center. The network 220 may be connected to a network of reference GPS receivers which provide differential GPS information and may also provide GPS ephemeris data for use in calculating the position of mobile systems. The network is coupled through the modem or other communication interface to the processor 203. The network 220 may be connected to other computers or network components. Also network 220 may be connected to computer systems operated by emergency operators, such as the Public Safety Answering Points which respond to 911 telephone calls. Various examples of methods for using a location server have been described in numerous U.S. patents, including: U.S. Pat. No. 5,841,396; U.S. Pat. No. 5,874,914; U.S. Pat. No. 5,812,087; and U.S. Pat. No. 6,215,442, all of which are hereby incorporated here by reference.

The location server 201, which is a form of a data processing system, includes a bus 202 which is coupled to a microprocessor 203 and a ROM 207 and volatile RAM 205 and a non-volatile memory 206. The processor 203 is coupled to cache memory 204 as shown in the example of FIG. 2. The bus 202 interconnects these various components together. While FIG. 2 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 202 may include one or more buses connected to each other through various bridges, controllers and/or adapters as is well known in the art. In many situations the location server may perform its operations automatically without human assistance. In some designs where human interaction is required, the I/O controller 209 may communicate with displays, keyboards, and other I/O devices.

Note that while FIG. 2 illustrates various components of a data processing system, it is not intended to represent any particular architecture or manner of interconnecting the components as such details are not germane to the present invention. It will also be appreciated that network computers and other data processing systems which have fewer components or perhaps more components may also be used with the present invention and may act as a location server or a PDE.

It will be apparent from this description that aspects of the present invention may be embodied, at least in part, in software. That is, the techniques may be carried out in a computer system or other data processing system in response to its processor executing sequences of instructions contained in memory, such as ROM 207, volatile RAM 205, non-volatile memory 206, cache 204 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the processor 203.

In some embodiments the methods of the present invention may be performed on computer systems which are simultaneously used for other functions, such as cellular switching, messaging services, etc. In these cases, some or all of the hardware of FIG. 2 would be shared for several functions.

While storing or retrieving terrain elevation data from a database can be performed on a location server, these operations may also be performed on other digital processing systems similar to that illustrated in FIG. 2.

Figure 3:
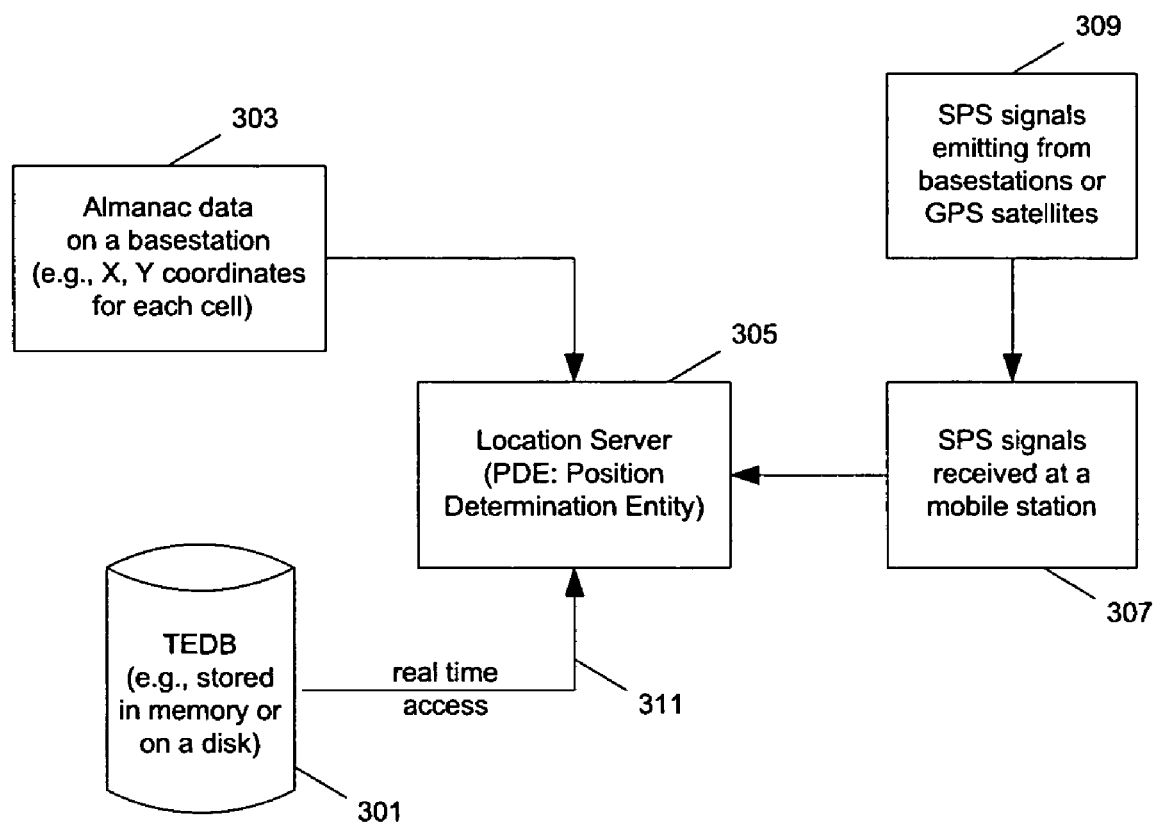
FIG. 3 shows a method to use a Terrain Elevation DataBase (TEDB) to provide terrain height information in real time during navigation processing in a Position Determination Entity (PDE) according to one embodiment of the present invention.

FIG. 3 shows a method to use a Terrain Elevation DataBase (TEDB) to provide terrain height information in real time during navigation processing in a Position Determination Entity (PDE) according to one embodiment of the present invention. Terrain Elevation DataBase (TEDB) 301 stored according to the present invention (e.g., in Random Access Memory (RAM) or a hard disk) provides real time access on line 311 to a location server 305 for altitude aiding. Location server 305 can efficiently retrieve an altitude for any given location in the process of determining a location of a mobile station.

In one example, almanac data 303 on a basestation provides an estimated horizontal position of the cell site to the location server, which may be used to obtain an initial estimate of the altitude of the mobile station.

SPS signals 309 emitting from basestations or GPS satellites (or other types of SPS satellites) are received at a mobile station. SPS signal 307 received at a mobile station is used to determine the times-of-arrival of the SPS signals emitting from the basestations or SPS satellites. Location server 305 uses the times-of-arrivals to determine the position of the mobile station.

In the process of iteratively determining the position of the mobile station, better estimations of the altitude of the mobile station can be retrieved from TEDB 301, when location server 305 determines more accurate horizontal coordinates of the mobile station from the times-of-arrival (or pseudoranges).

In another example, the horizontal position determined from the times-of-arrival can be used to retrieve an estimated altitude of the mobile station from the TEDB in order to determine the condition of the time-of-arrival (or pseudorange) measurements using the methods described in U.S. Pat. No. 6,061,018.

While FIG. 3 illustrates an example where the times-of-arrival are measured at a mobile station, such as in an AFLT system, an SPS system, or a hybrid AFLT system, it would be appreciated that such real time access to a TEDB can also be used in other positioning systems where the times-of-arrival are measured at basestations, such as in an TDOA system where times-of-arrival of a signal from a mobile station are determined at a plurality of basestations.

Figure 4:
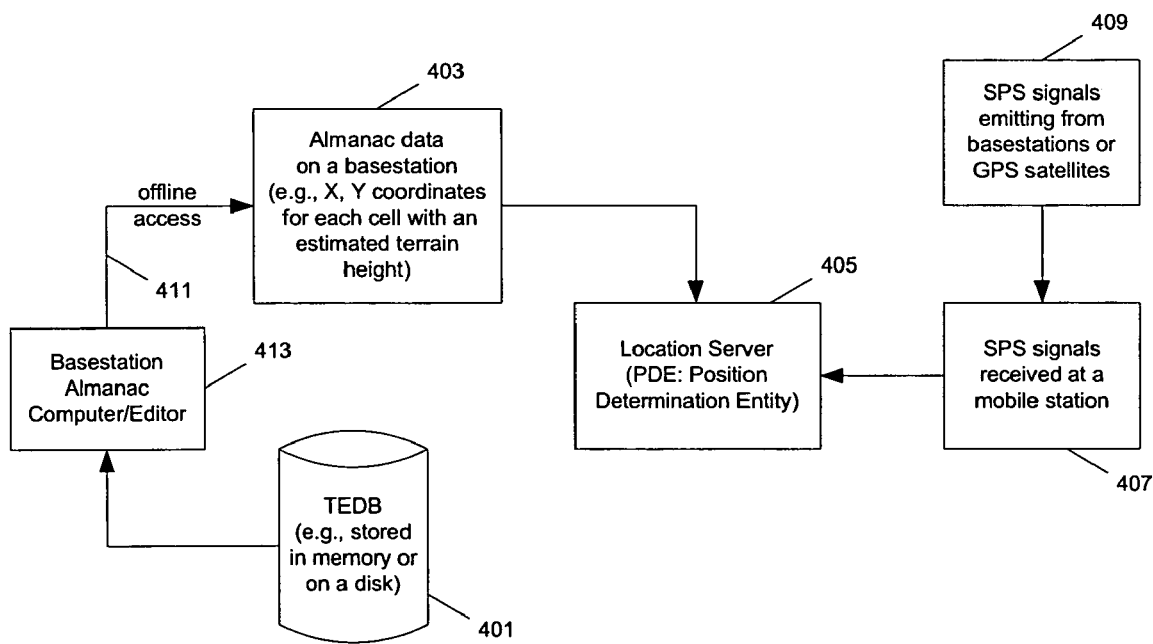
FIG. 4 shows a method to fill in height information for basestation almanac data, which information can be used during navigation processing in a Position Determination Entity (PDE) for altitude aiding, according to one embodiment of the present invention.

FIG. 4 shows a method to fill in height information for basestation almanac data, which information can be used during navigation processing in a Position Determination Entity (PDE) for altitude aiding, according to one embodiment of the present invention. Terrain Elevation DataBase (TEDB) 401 stored according to the present invention (e.g., in Random Access Memory (RAM) or a hard disk) provides offline access on line 411 to fill in altitude information in almanac data maintained on a basestation. In one example, a software module, called Basestation Almanac Computer/Editor (413), is used to compute the estimated terrain height for every cell sites listed in the almanac data maintained on the basestation. The estimated terrain height for every cell site is maintained on the basestation to provide altitude aiding to location server 405. However, when the offline accessing approach is used, the location server cannot obtain better estimates of the altitude of the mobile station once more accurate estimates of the horizontal position of the mobile station are determined from the times-of-arrive of the SPS signals received at the mobile station.

Figure 5:
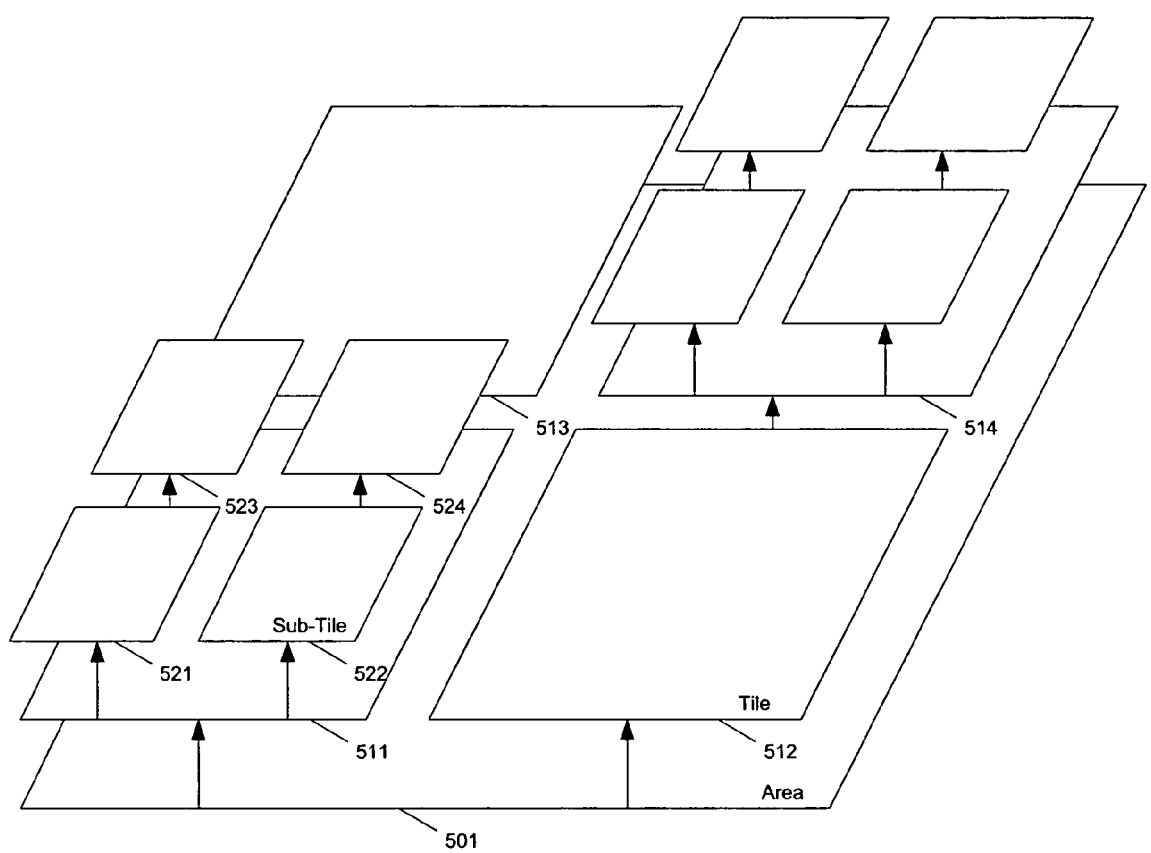
FIG. 5 shows a method to organize Digital Elevation Models according to one embodiment of the present invention.

FIG. 5 shows a method to organize Digital Elevation Models according to one embodiment of the present invention. Area 501 of a Digital Elevation Model is covered by a plurality of rectangular tiles (e.g., tiles 511, 512, 513, and 514). For example, area 501 may be the United States, or Korea, or Japan. When Digital Elevation Models of different resolutions are available for a certain region, a hierarchy of tiles is used. A tile at a lower level has a higher resolution; and a tile at a higher level has a lower resolution. A higher level tile has an indicator that indicates whether or not there are lower level tiles that model the same region of the area. For example, tile 511 and sub-tiles 521, 522, 523, 524 model the same region of area 501. Tile 511 is a higher level tile; tiles 521, 522, 523, and 524 are lower level tiles. If the elevation of a location cannot be determined from a lower level tile, the higher level tile that contains the lower level tile may be used to determine the elevation of the location with less precision.

Such a hierarchical grid scheme enables a fast search of data. The area that contains the location is identified first. The high level tile that contains the location is then identified. If there is a lower level tile, the lower level tile that contains the location is accessed. The tiles are hashed by coordinates along the latitudinal and the longitudinal directions so that the tile containing a given location can be easily identified from the horizontal coordinates of the location.

Figure 6:
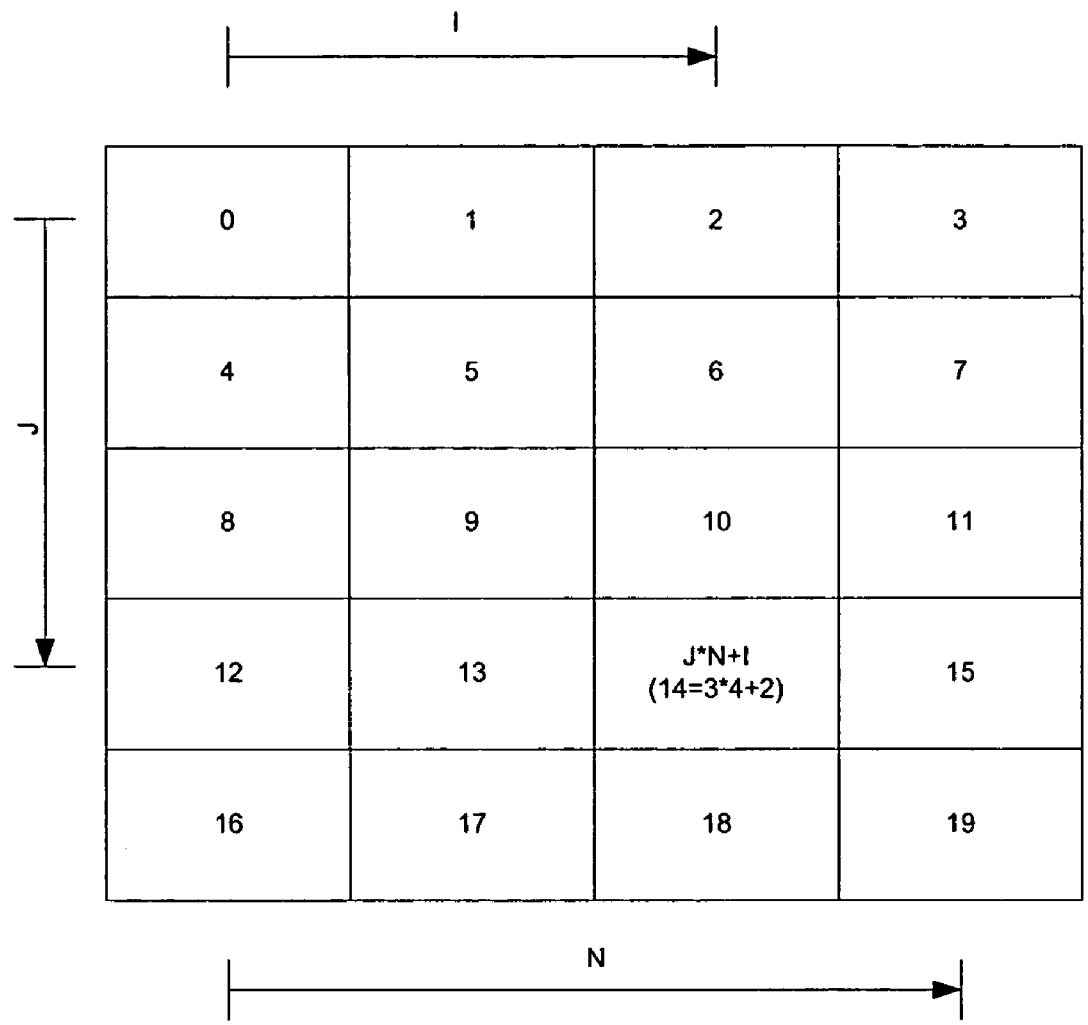
FIG. 6 shows an example scheme for numbering tiles in an area.

FIG. 6 shows an example scheme for numbering tiles. Such a scheme can be used to keep track of lower level tiles within a higher level tile or tiles within an area. Forming a rectangular grid, the tiles are countered in a column-wise or a row-wise fashion to index the tiles so that the index of a tile can be easily determined from its row and column indices. Its row and column indices can also be easily determined from the index of the tile. In the example of FIG. 6, the tiles are countered from the higher left (Northwest) corner of the region in a row-wise fashion. Assuming that the column index of a tile is I, the row index of the tile is J, and the number of columns of the grid is N, the index of the tile is J*N+I. Assuming the index of the tile is M, the column index I=mod (M, N); and the row index J=(M−I)/N. Since the column index and row index of the tile that contains a given location can be computed from the horizontal coordinates of the location and the position of the grid, the tile that contains the location can be easily identified.

Figure 7:
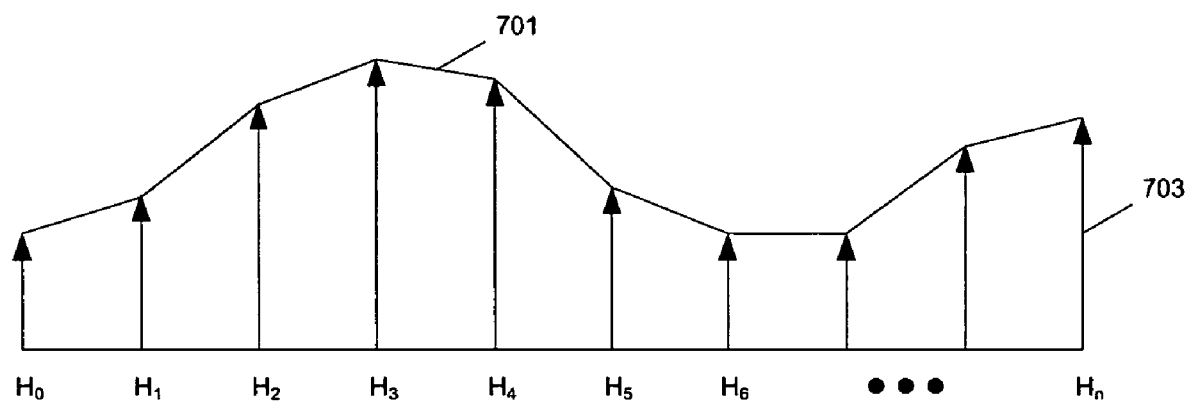
FIG. 7 shows an example of a profile of terrain elevation data.

FIG. 7 shows an example of a profile of terrain elevation. Along a latitudinal (or longitudinal) scan line in a tile of Digital Elevation Model, the elevations of a plurality of sample points forms a profile. An interpolation of the elevations at the sample points provides the elevation for any given point on the line. For example, height 703 represents the elevation at point $H_n$; and curve 701 represents an elevation model for the segment between points $H_0$ and $H_n$. Various 1D interpolation schemes may be used to generate curve 701.

Figure 8:
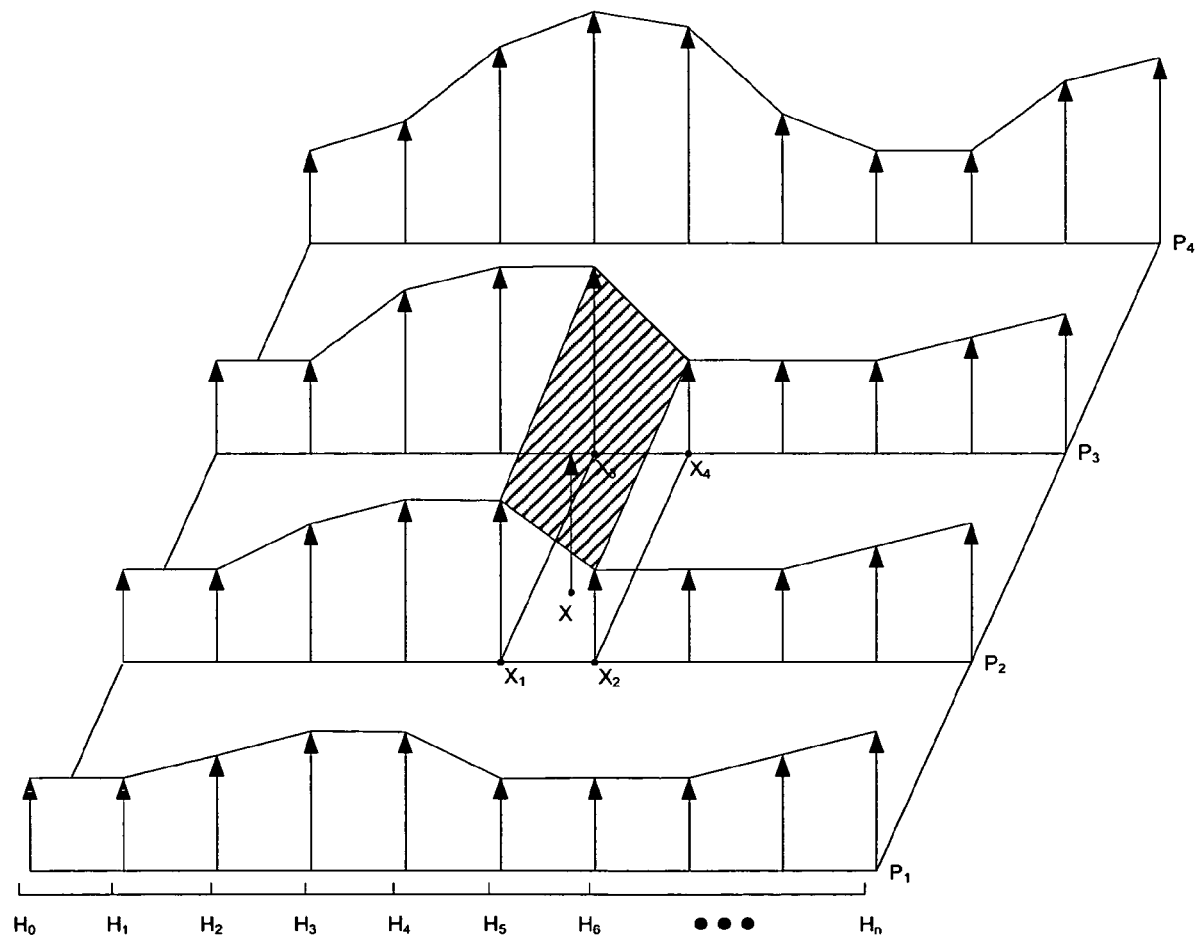
FIG. 8 shows a method to determining a terrain elevation for a location from a Digital Elevation Model (DEM) according to one embodiment of the present invention.

FIG. 8 shows a method to determining a terrain elevation for a location from a Digital Elevation Model (DEM) according to one embodiment of the present invention. A tile of DEM contains a plurality of profiles. For example, profiles $P_1$, $P_2$, $P_3$ and $P_4$ in FIG. 8 are contained within a single tile of DEM. The elevation of a location can be determined from the elevations of the sample points near the location. For example, the elevation of point X in FIG. 8 can be determined from an interpolation using the elevations at sample points $X_1$, $X_2$, $X_3$, and $X_4$. In the example of FIG. 8, a bi-linear interpolation is used to compute the elevation of a point between two profiles and between two lines of sample points (which are in a direction that is not parallel to the lines of profiles). In one embodiment of the present invention, a bi-quadratic interpolation scheme is used to determined the elevation of a location using the elevations of the sample points near the location in a tile of Digital Elevation Model.

The profile data for a tile is typically stored in an area specific coordinate system. For example, the horizontal coordinates may be represented in a WGS84 system, or in a NAD83 system, or in a system specific for Japan or Korea; and a vertical coordinate system may be a Mean Sea Level (MSL) system (e.g., NAD88 or NAD27), or a Height Above Ellipsoid (HAE) system. Note that different HAE systems (e.g., a WGS84 system, a WGS72 system, a Clarke 1866 system, or a Bessel 1841 system) may use different ellipsoid models (e.g., different semi-major axes and flattening ratios).

Datum tables can be used to define transformations from various different coordinate systems to one coordinate system (e.g., the coordinate used by a PDE, such as a WGS84 system).

Figure 9:
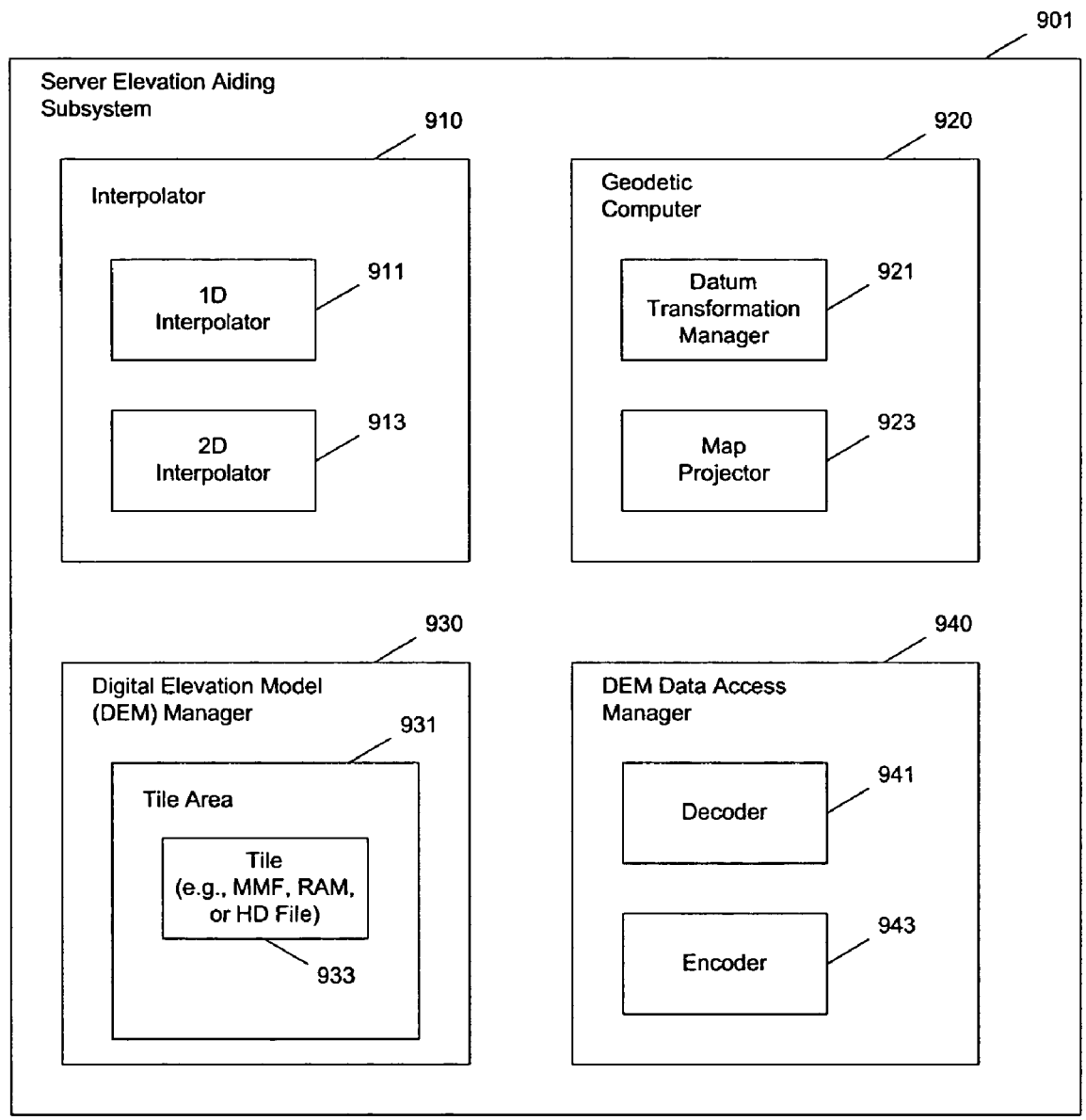
FIG. 9 shows a Server Elevation Aiding subsystem according to one embodiment of the present invention.

FIG. 9 shows a Server Elevation Aiding subsystem according to one embodiment of the present invention. Server Elevation Aiding subsystem 901 contains interpolator 910, geodetic computer 920, digital elevation model manager 930 and digital elevation model data access manager 940.

Interpolator 910 contains 1D interpolator 911 and 2D interpolator 913 to provide interpolation in 1D and 2D. In one embodiment of the present invention, the 2D interpolator can perform a bi-linear interpolation, which is used by NGS (National Geodetic Survey) and NIMA (National Imaging and Mapping Agency) for interpolation various grids of data. In another embodiment of the present invention, the 2D interpolator can also perform bi-quadratic interpolation to compute the elevation of a location from the elevations of the sample points near the location.

Geodetic computer 920 contains datum transformation manager 921 and map projector 923. Geodetic computer 920 is used to perform transformation of coordinates of a location between one coordinate system (e.g., a system used by a location server), and another coordinate system (e.g., a system used by a DEM tile). The common analytic transformation method of Molodensky can be used for the datum transformation for Japan; a NADCON interpolation based method can be used to transform USA NAD27 DEM data. When the horizontal coordinate system for the DEM tile is a WGS72 system, the Molodensky or a 7 parameter S-transformation may be used to perform the transformation. Geodetic computer 920 may also use other transformations, such as 3D similarity transformation (aka Bursa-Wolf transformation).

DEM manager 930 contains tile area 931, which further contains tiles of DEM (933). The tiles of DEM contain elevation data, stored in RAM, or in Memory Mapped Files (MMF), or files on a disk drive (e.g., a hard disk, a CD-ROM, a DVD-ROM, etc.). A DEM manager is used to store and manage the hierarchical list of tiles.

DEM data access manager 940 contains decoder 941 and encoder 943 to provide access to tiles for various storage mechanism (e.g., hard disk or memory). Encoder 943 can transform a DEM model from a flat file to an indexed and compressed TEDB using a method describe below. Decoder 941 can decode a DEM model encoded in an indexed and compressed TEDB in order to access the elevation data in the database.

Figure 10:
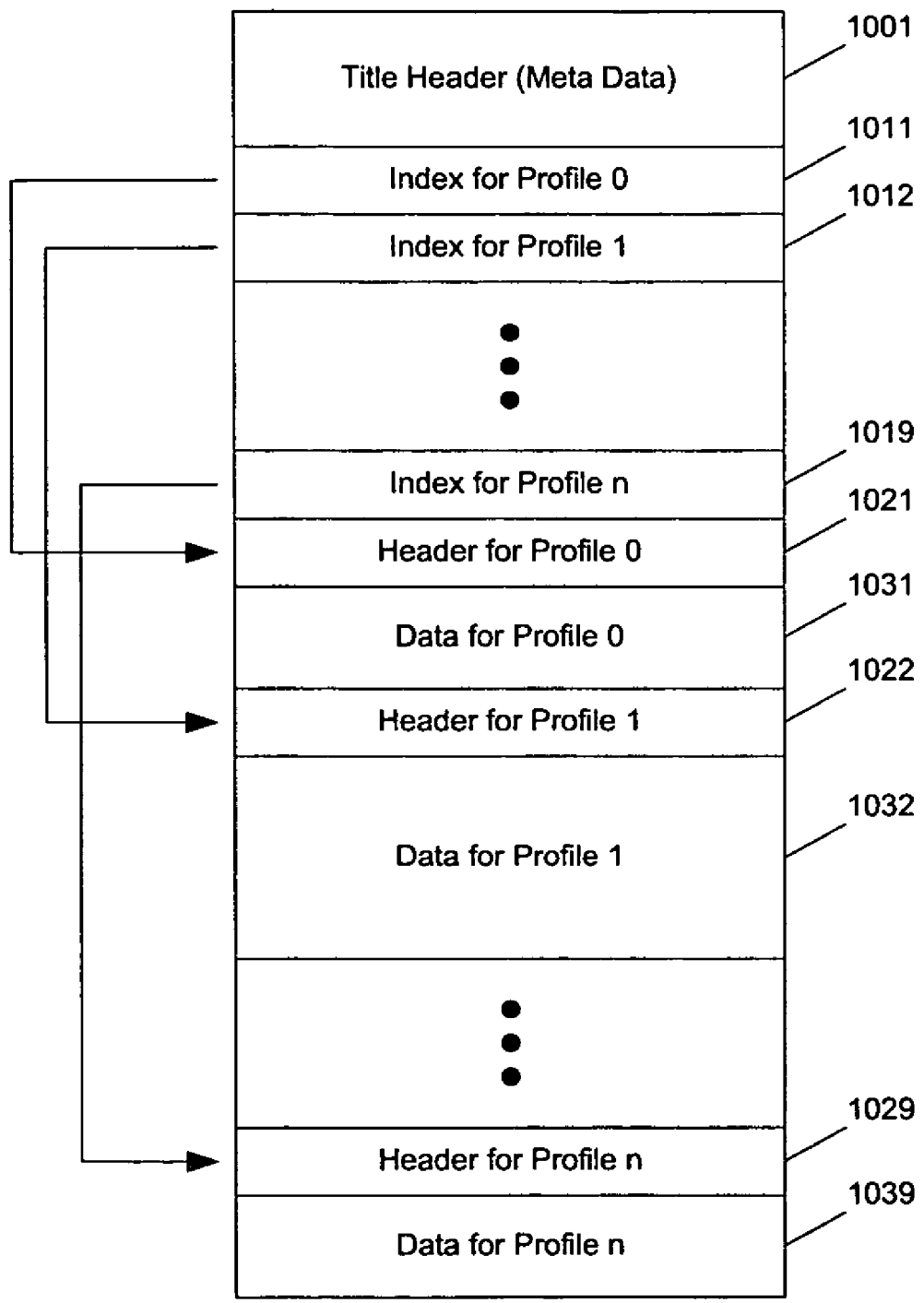
FIG. 10 shows a data representation of a tile of a Digital Elevation Model (DEM) according to one embodiment of the present invention.

FIG. 10 shows a data representation of a tile of a Digital Elevation Model (DEM) according to one embodiment of the present invention. According to one embodiment of the present invention, the data for various profiles in a tile is compressed using a scheme described below. To store the profiles in a tile in a storage space shown in FIG. 10, a tile header 1001 is used to specify the common data (meta data) for the tile, which is necessary for interpreting the DEM in the tile. Indices 1011-1019 are stored after tile header 1001 to indicating the locations of the starting points of the data for various profiles. For example, index 1012 points to header 1022 for profile 1, which contains meta data specific for interpreting compressed elevation data 1032 for profile 1. Similarly, index 1019 points to header 1029 for profile n. In general, compressed elevation data for various profiles requires storage spaces of different sizes. From the horizontal coordinates of a given location, the profiles that contains sample points near the location can be determined from the tile header. The indices for these profiles can be access to determine the location of the profile headers and the compressed elevation data for these profiles. The indices of the sample points near the location in the profiles can be determined from the tile header (and, in some embodiments, the profile headers).

Figure 11:
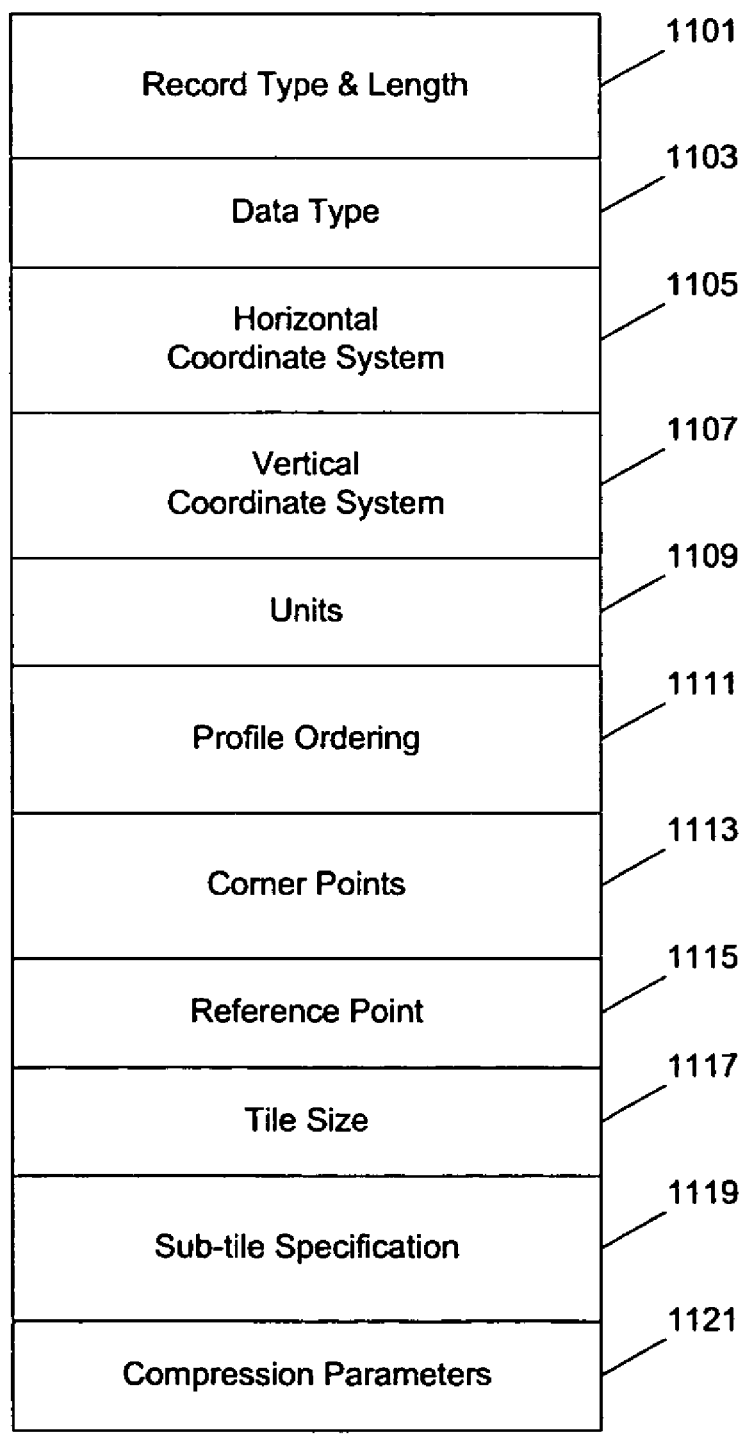
FIG. 11 shows a data representation of a header for storing a portion of a Digital Elevation Model (DEM) according to one embodiment of the present invention.

FIG. 11 shows a data representation of a header for storing a portion of a Digital Elevation Model (DEM) according to one embodiment of the present invention. Data 1101 contains the type of the record and the length of the header. The type of the record indicates whether the header is a profile header or a tile header. Item 1103 contains indicators showing the type of data contained in this tile, which may be DEM, Geoid, latitude or longitude datum translations. Horizontal coordinate system 1105 specifies the coordinate system used to represent the horizontal positions of the sample points, which can be a geographic system, a UTM system, etc. Vertical coordinate system 1107 specifies the coordinate system used to represent the elevations of the sample points, which can be Local SL, MSL, or HAE, etc. Units 1190 specify the units used in measuring the horizontal coordinates and the elevations. Profile ordering 1111 specifies the direction of profile lines (e.g., along longitudinal direction or along latitudinal direction), and numbers of sample points along both directions in a tile. Corner points 1113 specify the positions of the corner points of the tile. Reference point 1115 specifies the reference value for elevations, and the latitude and longitude of starting points for profiles. Tile size 1117 specifies the size of the tile in the latitudinal direction and in the longitudinal direction. Sub-tile specification 1119 indicates the size of the sub-tiles under the tile, if exist. Compression parameters 1121 include the scaling factor used in encoding the elevation data and an indicator showing whether or not the elevations data is run length encoded. Details about the scaling factor and run length encoding are described below.

From the above description, it would be apparent to one skilled in the art that various data representation of headers may be used for tile headers or profile headers. Tile headers and profile headers may have different formats; a tile header may have more or less data items than that shown in FIG. 11; and a profile header may have more or less data items than that shown in FIG. 11. For example, a tile header may further include a string showing the source of the DEM (e.g., from a USGS model or from an NGS model) or byte ordering information; meanwhile, a profile header may not have items 1105 and 1107 for specifying the coordinate systems, since all the profiles within a tile used the same coordinate system.

Figure 12:
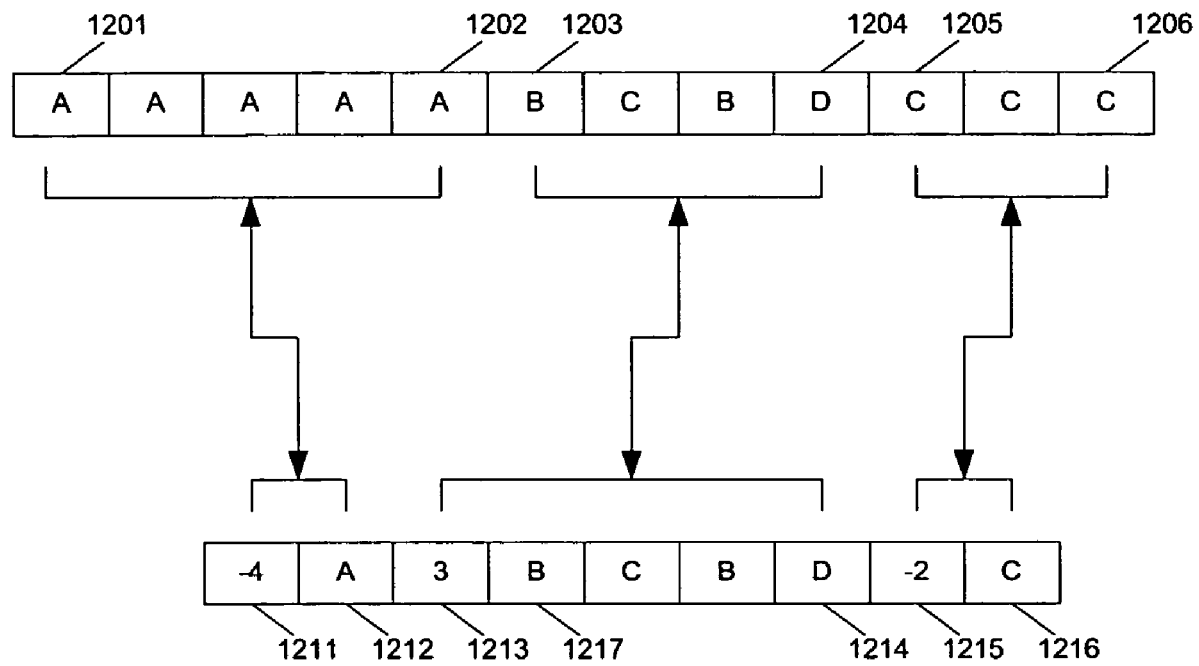
FIG. 12 shows a Run Length Encoding scheme which can be used with the present invention.

FIG. 12 shows a Run Length Encoding scheme which can be used with the present invention. A string of symbols (e.g., numbers representing elevations) can be segmented as runs and sequences. A run is a continuous repetitive string of a particular symbol. A sequence is a continuous non-repetitive string of symbols. For example, the string of symbols between symbols 1201 and 1202 is a run; and the string of symbols between symbols 1203 and 1204 is a sequence. A run can be encoded as a number indicating the number of repetition of the symbol and the symbol itself. For example, the run between the symbols 1201 and 1202 is encoded as number 1211, which is equal to the number of repetition subtracted from one, and symbol 1212. Similarly, a sequence can be encoded as a number indicating the length of the string of non-repetitive symbols and the string of non-repetitive symbols. For example, the sequence between symbols 1203 and 1204 is represented by number 1213, which is equal to one subtracted from the number of symbols between symbols 1203 and 1204, and a copy of the symbols (symbols between 1217 and 1214). Similarly, the run between symbols 1205 and 1206 is encoded as number 1215 and 1216. In the example of FIG. 12, a run is represented by a negative number preceding a symbol; and a sequence is represented by a non-negative number preceding a string of symbols. Thus, the encoded data between 1211 and 1216 can be decoded to recover the original string of symbols (between 1201 and 1206) in a decoding process.

Figure 13:
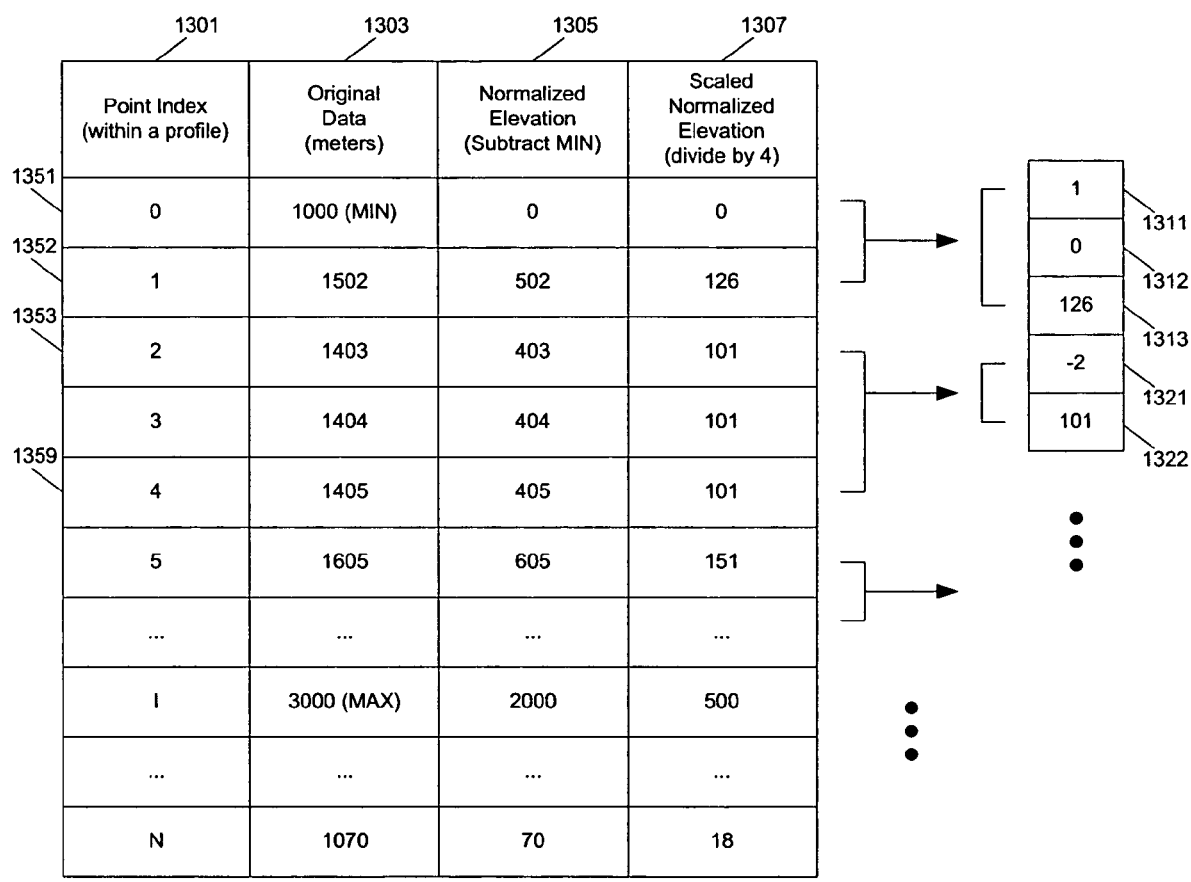
FIG. 13 illustrates an example of encoding a portion of a Digital Elevation Model (DEM) for storage according to one embodiment of the present invention.

FIG. 13 illustrates an example of encoding a portion of a Digital Elevation Model (DEM) for storage according to one embodiment of the present invention. Column 1303 represents the original elevation data of a DEM profile. The sample point on row 1351 contains the minimum of the elevations for this profile. Column 1305 represents the normalized elevations, which is obtained from subtracting the minimum value from the original data in column 1303. Column 1307 represents the scaled elevations, which is obtained from dividing the normalized elevations in column 1305 by a scaling factor (four). In one embodiment of the present invention, the scaling factors are such that the division of integers can be carried out by bit shift operations during the encoding process and the multiplication of integers can be carried out by bit shift operations during the decoding process. In one embodiment of the present invention, when the elevations are measured in the unit of meter, the maximum scaling factor is 4 (i.e., the Least Significant Bit (LSB) of a scaled elevation represents 4 meters); when the elevations are measured in the unit of foot, the maximum scaling factor is 16 (i.e., LSB=16 feet). After the normalization and scaling process, the range of the scaled elevations may be reduced so that the scaled elevations can be represented by integers that take less storage spaces. In one embodiment of the present invention, the original data is represented by 2-byte integers. After the normalization and scaling process, some profiles can be represented by scaled and normalized elevations as 1-byte integers. The scaled and normalized elevations in column 1307 can be further compressed using a run length encoding scheme. For example, scaled elevations between rows 1351 and 1352 can be encoded as a sequence (1311, 1312 and 1313); and those between rows 1353 and 1359 can be encoded as a run (1321 and 1322).

Figure 14:
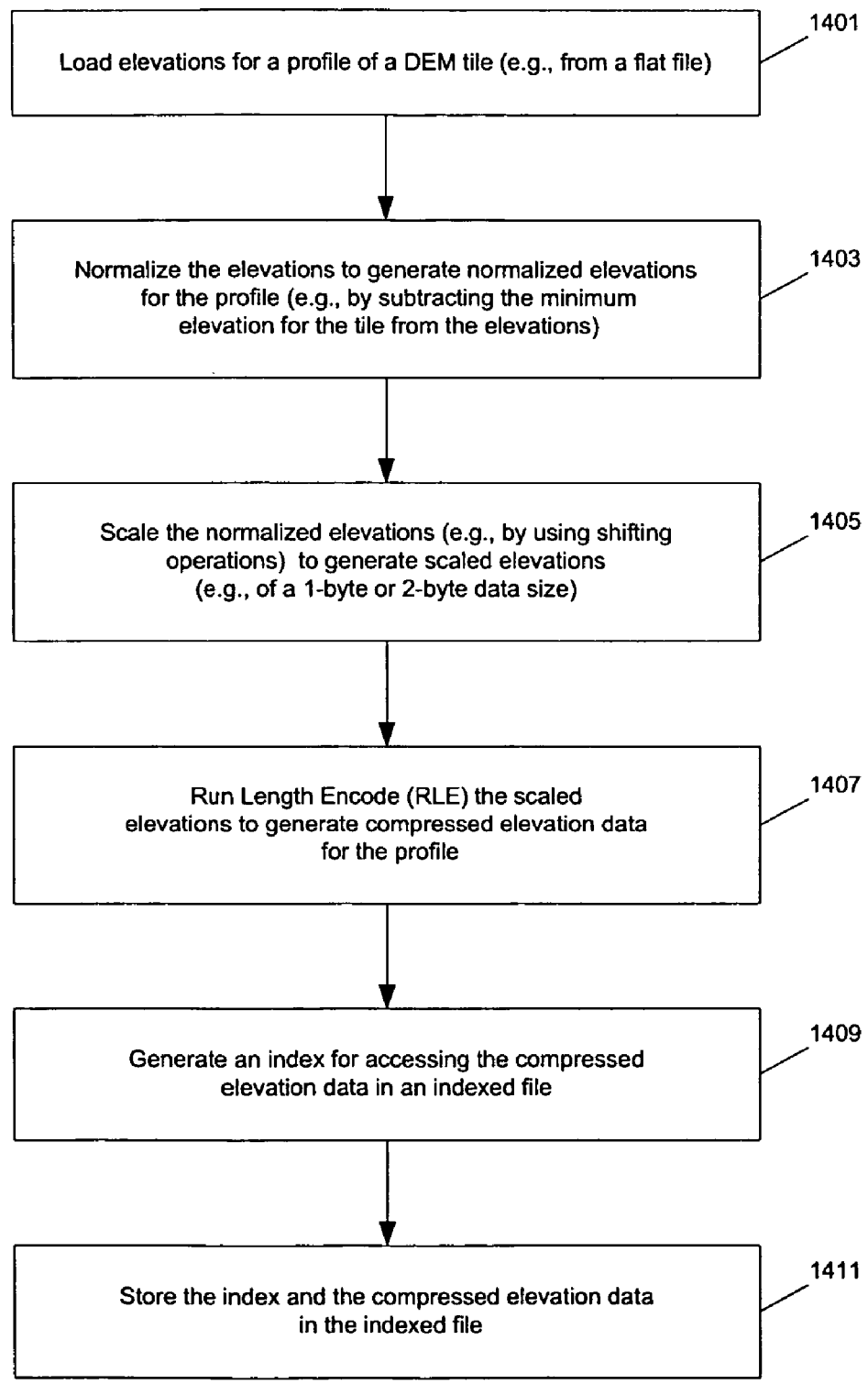
FIG. 14 shows a method to encode a portion of a Digital Elevation Model (DEM) for storage according to one embodiment of the present invention.

FIG. 14 shows a method to encode a portion of a Digital Elevation Model (DEM) for storage according to one embodiment of the present invention. Operation 1401 loads elevations for a profile of a DEM tile. Typically, elevation data are read from a flat file (non-indexed) that contains a Digital Elevation Model of an area (e.g., the United States, or the world). Such a flat file is large in size. To efficiently store and access the Digital Elevation Model, operations 1403-1411 are used to compress the data and to store the data in one or more indexed files. Operation 1403 generates normalized elevations for the profile. The elevations of the profile are normalized with respect to a reference value. In one embodiment of the present invention, the normalized elevations are generated from subtracting the minimum elevation for the DEM tile from the elevations. In another embodiment, the elevations are normalized with respect to the minimum elevation of the profile (or mean elevation of the profile). Operation 1405 scales the normalized elevations to generate scaled elevations. In one embodiment of the present invention, the scaled elevations requires less storage space than the elevations loaded from a flat file, since the range of data is reduced after the normalizing and scaling operations. For example, original elevation data for a profile that is represented by 2-byte integers can be represented by 1-byte scaled elevations. Operation 1407 run length encodes the scaled elevations to generate compressed elevation data for the profile. Operation 1409 generates an index for accessing the compressed elevation data in an indexed file. The index and the compressed elevation data are stored in the indexed file in operation 1411.

Operations 1401-1411 can be repeated to encode (compress) a plurality of profiles of a DEM tile and to store the compressed elevation data for the profiles of the tile in one indexed file. In one embodiment, compressed elevation data for different tiles of a Digital Elevation Model are stored in different files. One indexed file is used for each of the tiles. Alternatively, multiple tiles of compressed elevation data can be stored in one indexed file, where indices for accessing each of the tiles are stored for fast accesses to individual tiles. Multiple tiles of a DEM that models a specific geographical area can be organized as an area of a DEM. A DEM may have a plurality of areas. Typically, the elevation data for the tiles of DEM are represented in area specific coordinate systems.

When multiple DEMs of different resolutions are available, the tiles from different DEMs are organized in a hierarchy as described above (See FIG. 5). The indexed files store the indicators linking the tiles of different levels in the hierarchy.

The compressed and indexed elevation data of one or more Digital Elevation Models forms a Terrain Elevation DataBase (TEDB).

Figure 15:
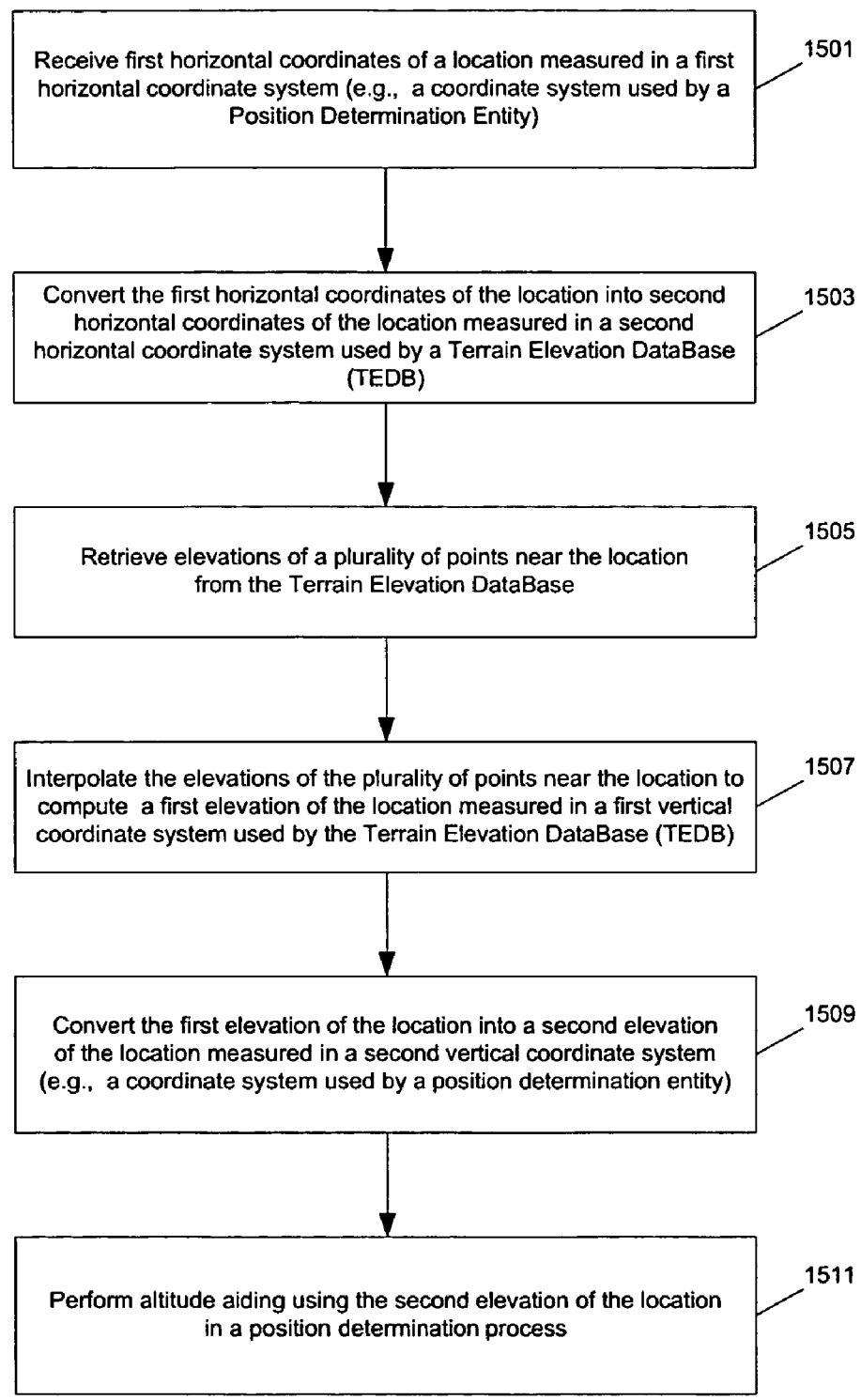
FIG. 15 shows a method to compute the elevation of a location according to one embodiment of the present invention.

FIG. 15 shows a method to compute the elevation of a location according to one embodiment of the present invention. After operation 1501 receives first horizontal coordinates of a location measured in a first horizontal coordinate system (e.g., a coordinate system used by a Position Determination Entity), operation 1503 converts the first horizontal coordinates of the location into second horizontal coordinates of the location measured in a second horizontal coordinate system used by a Terrain Elevation DataBase (TEDB). A typical Position Determination Entity uses a WGS84 system for specifying a horizontal position; and a TEDB typically stores profiles using area specific coordinate systems for various areas, such as a Universal Transverse Mercator (UTM) system, a geographic system (latitude, longitude), a local coordinates system for a region (e.g., a US state plane based system), etc. Thus, a conversion in operation 1503 is used to generate coordinates that can be used to search elevation data in the TEDB near the location specified by the first horizontal coordinates. Operation 1505 retrieves elevations of a plurality of points near the location from the Terrain Elevation DataBase. After operation 1507 interpolates the elevations of the plurality of points near the location to compute a first elevation of the location measured in a first vertical coordinate system used by the Terrain Elevation DataBase, operation 1509 converts the first elevation of the location into a second elevation of the location measured in a second vertical coordinate system (e.g., a coordinate system used by a Position Determination Entity). A typical Position Determination Entity uses a Height Above Ellipsoid (HAE) system for specifying an elevation (altitude); and a TEDB typically stores profiles using area specific coordinate systems for various areas, such as a Means Sea Level (MSL) system, a Local Sea Level (Local SL) system, or a Height Above Ellipsoid system. In one embodiment of the present invention, the estimated accuracy (standard error) of the interpolated terrain elevation is also computed in operation 1507. Operation 1511 performs altitude aiding using the second elevation of the location. Alternatively, the second elevation of the location can be provided to a Position Determination Entity to perform altitude aiding. The computation of the second elevation for altitude aiding can be in the form of real time access as illustrated in FIG. 3, or in the form of offline access as illustrated in FIG. 4. Various altitude aiding methods, such as those described in U.S. Pat. No. 6,061,018, can be used with the present invention.

In one embodiment of the invention, the area of DEM that contains the location is identified and retrieved in order to retrieve elevations for a plurality of points near the location from the Terrain Elevation DataBase. Then, the tile of DEM that contains the location is identified and retrieved. From the header of the tile, the profiles that contain points near the location are identified and accessed. From the headers of the profiles and the header of the tile, the points near the location are identified. After decoding at least portions of the compressed profiles in the Terrain Elevation DataBase, the elevations of the plurality of points near the location can be retrieved.

Figure 16:
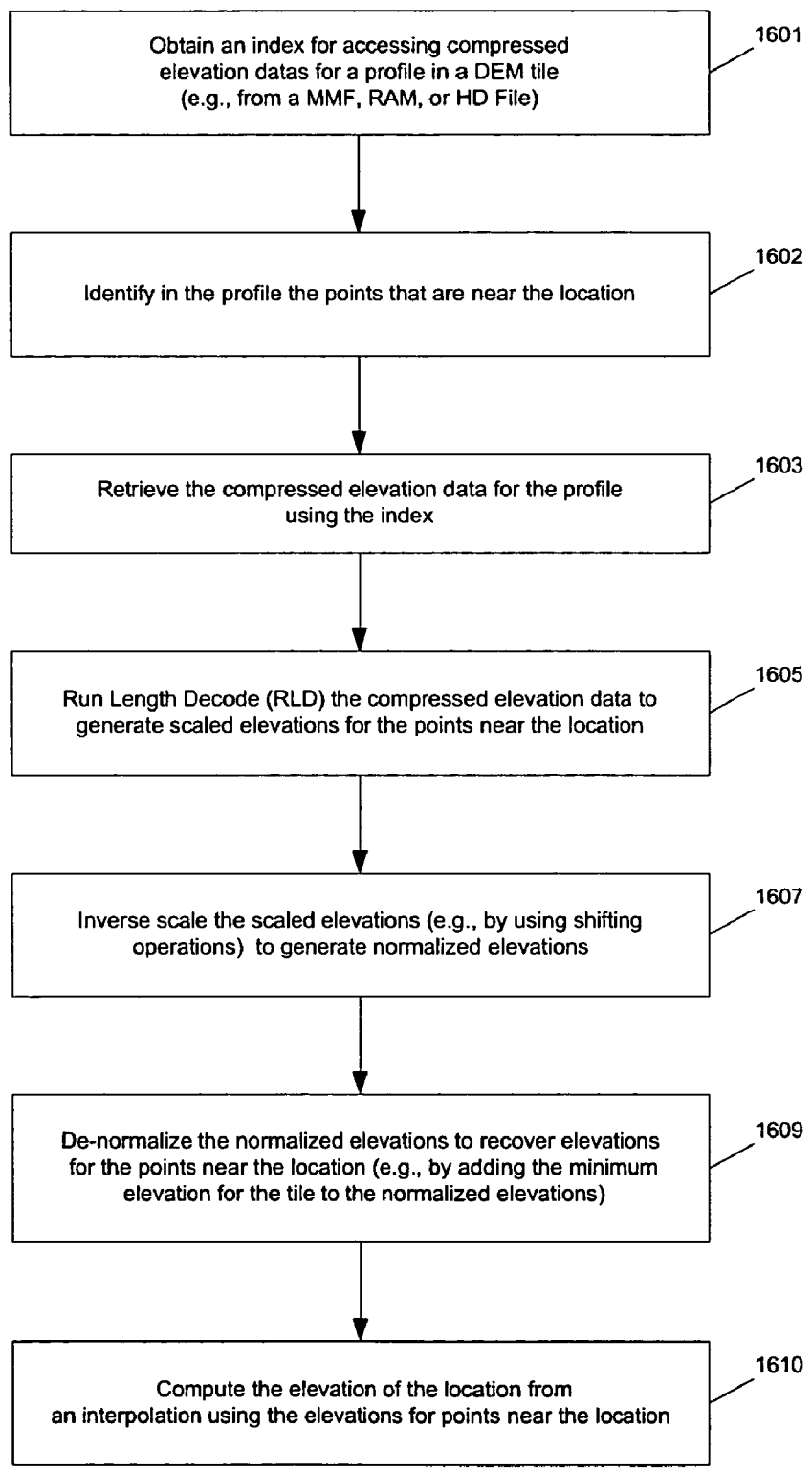
FIG. 16 shows one method to retrieve and decode a portion of a Digital Elevation Model (DEM) for computing the elevation of a location according to one embodiment of the present invention.

FIG. 16 shows one method to decode a portion of a Digital Elevation Model (DEM) for computing the elevation of a location according to one embodiment of the present invention. Operation 1601 obtains an index for accessing compressed elevation data for a profile in a DEM tile. The DEM tile may be stored in a Memory Mapped File (MMF), or in RAM, or in a file on a file system of a digital processing system (e.g., on a hard drive, a CD-ROM, or a network file), etc. For example, in FIG. 10, after identifying that profile n contains points near the location, index 1019 for profile n is obtained in order to access the compressed data 1039 for profile n.

Operation 1602 identifies the points that are near the location in the profile. In one embodiment of the present invention, the index is used to retrieve the profile header, from which the indices of the sample points in the profile, which are near the location, are computed. In another embodiment, the indices of the sample points near the location are computed using the information in the tile header. Alternatively, computing the indices of the sample points near the location may involve both the tile header and the profile headers.

After operation 1603 retrieves the compressed elevation data for the profile, operation 1605 run length decodes the compressed elevation data to generate scaled elevations for the points near the location. In general, it is necessary to run length decode a portion of a compressed profile to obtain the scaled elevations for the points near the location. Operation 1607 inverse scales the scaled elevations to generate normalized elevations. Operation 1609 de-normalizes the normalized elevations to recover the elevations for the points near the location. The reference elevation that is subtracted from the original elevation data in the decoding process is added back to the normalized elevations to reproduce the elevations of the points near the location. Operation 1610 computes the elevation of the location from an interpolation using the elevations of the points near the location. In one embodiment of the present invention, operations 1601-1609 are repeated for a plurality of profiles near the location to obtain elevations of a plurality of points in the plurality of profiles before operation 1610 is performed to compute the elevation of the location; and, a bi-quadratic interpolation is used to compute the elevation of the location.

Since Terrain Elevation DataBases according various embodiments of the present invention store the elevation data in a compressed and indexed format, less storage space is required. Thus, the compressed elevation data from a high resolution Digital Elevation Model (DEM) can be stored in storage media with faster access speeds (e.g., RAM or memory mapped file) for real time altitude aiding in the process of position determination in wireless assisted hybrid positioning system.

Although the present invention is illustrated with an example where each of profiles contains elevation data for sample points on a single scan line, the present invention can also be applied when each of the profiles contains elevation data for sample points on a plurality of scan lines.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A computer implemented method to store elevation data, the method comprising:

compressing elevation data of a first portion of a Digital Elevation Model (DEM), in part, by normalizing elevation data within the first portion to generate first compressed elevation data, wherein normalizing elevation data includes subtracting a reference elevation from each elevation data value in the first portion;

storing the first compressed elevation data in a storage location of a storage media pointed to by a first index; and storing the first index in the storage media.

2. A method as in claim 1 further comprising:

storing parameters required for determining whether or not a location is in the first portion of the Digital Elevation Model.

3. A method as in claim 1 further comprising:

storing data specifying a coordinate system used to represent the elevation data of the first portion of the Digital Elevation Model.

4. A method as in claim 1 wherein said compressing the elevation data of the first portion comprises:

subtracting a reference elevation from the elevation data in the first portion from the elevation data of the first portion of the Digital Elevation Model (DEM) to generate normalized elevation data; and scaling the normalized elevation data to generate scaled elevation data.

5. A method as in claim 4 wherein said compressing the elevation data of the first portion further comprises:

run length encoding the scaled elevation data to generate the first compressed elevation data.

6. A method as in claim 1 wherein the first portion is a profile of the Digital Elevation Model.

7. A method as in claim 1 further comprising:

dividing an area of the Digital Elevation Model into a plurality of tiles; and storing parameters required for determining whether or not a location is in one of the plurality of tiles;

wherein the first portion is one of a plurality of profiles in one of the plurality of tiles.

8. A method as in claim 7 further comprising:

dividing the Digital Elevation Model into a plurality of areas; and storing parameters required for determining whether or not a location is in one of the plurality of areas.

9. A machine readable media containing executable computer program instructions which when executed by a digital processing system cause said system to perform a method to store elevation data, the method comprising:

compressing elevation data of a first portion of a Digital Elevation Model (DEM) to generate first compressed elevation data;

storing the first compressed elevation data in a storage location pointed to by a first index; and storing the first index;

dividing an area of the DEM into a plurality of tiles;

dividing at least a first of the plurality of tiles into a plurality of subtiles;
storing parameters required for determining whether or not a location is in one of the plurality of tiles; and
storing parameters for determining whether or not the location is in one of the plurality of subtiles;
wherein the first portion is one of a plurality of profiles in one of the plurality of tiles.

10. A media as in claim 9 wherein the method further comprises:
storing data specifying a coordinate system used to represent the elevation data of the first portion of the Digital Elevation Model.

11. A media as in claim 9 wherein said compressing the elevation data of the first portion comprises:
subtracting a reference elevation from the elevation data of the first portion of the Digital Elevation Model (DEM) to generate normalized elevation data; and
scaling the normalized elevation data to generate scaled elevation data.

12. A media as in claim 11 wherein said compressing the elevation data of the first portion further comprises:
run length encoding the scaled elevation data to generate the first compressed elevation data.

13. A media as in claim 9 wherein the first portion is a profile of the Digital Elevation Model.

14. A digital processing system to store elevation data, the digital processing system comprising:
means for compressing elevation data of a first portion of a Digital Elevation Model (DEM) to generate first compressed elevation data;
means for storing the first compressed elevation data in a storage location pointed to by a first index; and
means for storing the first index;
means for dividing an area of the Digital Elevation Model into a plurality of tiles;
means for dividing at least a first of the plurality of tiles into a plurality of subtiles;
means for storing parameters required for determining whether or not a location is in one of the plurality of tiles;
means for storing parameters for determining whether or not the location in one of the plurality of subtiles;
a processor; and
storage media configured to store processor executable instructions;
wherein the first portion in one of a plurality of profiles in one of the plurality of tiles.

15. A digital processing system as in claim 14 further comprising:
means for storing data specifying a coordinate system used to represent the elevation data of the first portion of the Digital Elevation Model.

16. A digital processing system as in claim 14 wherein said means for compressing the elevation data of the first portion comprises:
means for subtracting a reference elevation from the elevation data of the first portion of the Digital Elevation Model (DEM) to generate normalized elevation data; and
means for scaling the normalized elevation data to generate scaled elevation data.

17. A digital processing system as in claim 16 wherein said means for compressing the elevation data of the first portion further comprises:
means for run length encoding the scaled elevation data to generate the first compressed elevation data.

18. A digital processing system as in claim 14 wherein the first portion is a profile of the Digital Elevation Model.

19. A machine readable media containing a data stream representing a Digital Elevation Model, the data stream being produced by a method comprising:
compressing elevation data of a first portion of a Digital Elevation Model (DEM), including normalizing the elevation data to generate first compressed elevation data, wherein normalizing elevation data includes subtracting a reference elevation from each elevation data value in the first portion;
storing the first compressed elevation data in a storage location pointed to by a first index as part of the data stream; and
storing the first index as part of the data stream.

20. A media as in claim 19 wherein the method further comprises:
storing parameters required for determining whether or not a location is in the first portion of the Digital Elevation Model as part of the data stream.

21. A media as in claim 19 wherein the method further comprises:
storing data specifying a coordinate system used to represent the elevation data of the first portion of the Digital Elevation Model as part of the data stream.

22. A media as in claim 19 wherein said compressing the elevation data of the first portion comprises:
subtracting a reference elevation from the elevation data of the first portion of the Digital Elevation Model (DEM) to generate normalized elevation data; and
scaling the normalized elevation data to generate scaled elevation data.

23. A media as in claim 22 wherein said compressing the elevation data of the first portion further comprises:
run length encoding the scaled elevation data to generate the first compressed elevation data.

24. A computer implemented method to store elevation data, the method comprising:
dividing a first portion of a Digital Elevation Model (DEM) into a plurality of tiles;
for each of the plurality of tiles, compressing elevation data within the tile according to a first resolution;
dividing at least one of the plurality of tiles into a plurality of subtiles;
for each of the plurality of subtiles, compressing elevation data within the subtile according to a second resolution that has a higher resolution than the first resolution;
storing in a storage media, parameters for determining whether a location is in one of the plurality of tiles; and
storing in the storage media, parameters for determining whether the location is in one of the plurality of subtiles.

* * * * *

UNITED STATES PATENT AND TRADEMARK OFFICE
CERTIFICATE OF CORRECTION

PATENT NO. : 7,664,764 B2
APPLICATION NO. : 11/143350
DATED : February 16, 2010
INVENTOR(S) : Zoltan Biacs It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 605 days.

Signed and Sealed this

Twenty-eighth Day of December, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,664,764 B2 |
| APPLICATION NO. | : 11/143350 |
| DATED | : February 16, 2010 |
| INVENTOR(S) | : Biacs |

It is certified that error appears in the above-identified patent and that said Letters Patent is hereby corrected as shown below:

Column 15, line 42, claim 14: "location in" to read as --location is in--

Column 15, line 46, claim 14: "portion in one" to read as --portion is one--

Signed and Sealed this
Thirty-first Day of May, 2011

David J. Kappos
*Director of the United States Patent and Trademark Office*